(12) United States Patent
Chen et al.

(10) Patent No.: US 12,538,606 B2
(45) Date of Patent: Jan. 27, 2026

(54) SOLAR CELL, PHOTOVOLTAIC MODULE, AND ELECTRICAL DEVICE

(71) Applicant: CONTEMPORARY AMPEREX TECHNOLOGY (HONG KONG) LIMITED, Hong Kong (CN)

(72) Inventors: Guodong Chen, Ningde (CN); Zhaohui Liu, Ningde (CN); Weile Lin, Ningde (CN); Wenming Guo, Ningde (CN); Yongsheng Guo, Ningde (CN); Yandong Wang, Ningde (CN); Shuojian Su, Ningde (CN); Yanfen Wang, Ningde (CN); Chuying Ouyang, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 23 days.

(21) Appl. No.: 18/602,023

(22) Filed: Mar. 12, 2024

(65) Prior Publication Data
US 2024/0213385 A1    Jun. 27, 2024

Related U.S. Application Data

(63) Continuation of application No. PCT/CN2022/129487, filed on Nov. 3, 2022.

(30) Foreign Application Priority Data

Dec. 27, 2021  (CN) .......................... 202111610614.8

(51) Int. Cl.
*H10F 77/14*  (2025.01)
*H10F 19/20*  (2025.01)

(52) U.S. Cl.
CPC ............. *H10F 77/14* (2025.01); *H10F 19/20* (2025.01)

(58) Field of Classification Search
CPC ................................. H10F 77/14; H10F 19/20
See application file for complete search history.

(56) References Cited

U.S. PATENT DOCUMENTS

| 2008/0121264 | A1* | 5/2008 | Chen ....................... H10F 19/33 257/E27.125 |
| 2011/0265846 | A1 | 11/2011 | Nasuno et al. |
| 2015/0136197 | A1 | 5/2015 | Kim |

FOREIGN PATENT DOCUMENTS

| CN | 101192617 A | 6/2008 |
| CN | 104701397 A | 6/2015 |

(Continued)

OTHER PUBLICATIONS

The World Intellectual Property Organization (WIPO) International Search Report for PCT/CN2022/129487 Jan. 17, 2023 4 Pages (including translation).

(Continued)

*Primary Examiner* — Tae-Sik Kang
(74) *Attorney, Agent, or Firm* — ANOVA LAW GROUP, PLLC

(57) ABSTRACT

A solar cell includes a plurality of sub-cells. The plurality of sub-cells are disposed sequentially along a first direction. The plurality of sub-cells each include a first photovoltaic conversion layer for performing photovoltaic conversion. The first direction is perpendicular to a thickness direction of the sub-cells. Along the first direction, a trend of change in a thickness of the first photovoltaic conversion layer of each sub-cell is negatively correlated to a trend of change in a cross-sectional area, perpendicular to the thickness direction, of each first photovoltaic conversion layer, so as to (Continued)

improve uniformity of photocurrents output by the sub-cells and uniformity of electrical current.

10 Claims, 2 Drawing Sheets

(56) References Cited

FOREIGN PATENT DOCUMENTS

| | | | |
|---|---|---|---|
| CN | 106684209 | B | 3/2018 |
| CN | 112054078 | A | 12/2020 |
| EP | 2309540 | A1 | 4/2011 |
| EP | 2876691 | A1 | 5/2015 |
| JP | 2010161300 | A | 7/2010 |
| JP | 2013089963 | A | 5/2013 |
| JP | 2018026539 | A | 2/2018 |
| JP | 2021019203 | A | 2/2021 |
| KR | 101114193 | B1 | 3/2012 |

OTHER PUBLICATIONS

The European Patent Office (EPO) The Extended European Search Report for Application No. 22913784.9 Jan. 10, 2025 8 Pages.
The Japan Patent Office (JPO) Notice of Reasons for Refusal for Application No. 2024-534664 May 7, 2025 9 Pages (including translation).
The Korean Intellectual Property Office Request for the Submission of an Opinion for Application No. 10-2024-7018560 Jun. 24, 2025 15 Pages (including translation).

\* cited by examiner

SOLAR CELL, PHOTOVOLTAIC MODULE, AND ELECTRICAL DEVICE

CROSS-REFERENCE TO RELATED APPLICATIONS

This application is a continuation of International Application No. PCT/CN2022/129487, filed on Nov. 3, 2022, which claims priority to Chinese Patent Application No. 202111610614.8, filed on Dec. 27, 2021 and entitled "SOLAR CELL, PHOTOVOLTAIC MODULE, AND ELECTRICAL DEVICE", the entire contents of both of which are incorporated herein by reference.

TECHNICAL FIELD

This application relates to the technical field of battery production, and in particular, to a solar cell, a photovoltaic module, and an electrical device.

BACKGROUND

A solar cell is a photovoltaic conversion device that directly converts optical energy into electrical energy, possesses excellent photovoltaic properties, and can be prepared in a simple method, thereby bringing new space and hope for photovoltaic power generation.

In a production process of solar cells, how to improve the photovoltaic conversion efficiency is an urgent problem.

SUMMARY

This application provides a solar cell, a photovoltaic module, and an electrical device to improve the photovoltaic conversion efficiency of the solar cell.

According to a first aspect, this application discloses a solar cell. The solar cell includes a plurality of sub-cells. The plurality of sub-cells are disposed sequentially along a first direction. The plurality of sub-cells each include a first photovoltaic conversion layer for performing photovoltaic conversion. The first direction is perpendicular to a thickness direction of the sub-cells. Along the first direction, a trend of change in a thickness of the first photovoltaic conversion layer of each sub-cell is negatively correlated to a trend of change in a cross-sectional area, perpendicular to the thickness direction, of each first photovoltaic conversion layer, so as to improve uniformity of photocurrents output by the sub-cells.

In the above technical solution, along the first direction, the trend of change in the thickness of the first photovoltaic conversion layer of each sub-cell is negatively correlated to the trend of change in the cross-sectional area, perpendicular to the thickness direction, of each first photovoltaic conversion layer, and the photocurrents converted and output by different sub-cells are substantially consistent. In this way, it is avoided that some of the sub-cells limit the current of the solar cell. The aggregate current output by the solar cell is increased, the power of the solar cell is improved, and in turn, the photovoltaic conversion efficiency of the solar cell is improved. In addition, the photocurrents of all sub-cells are substantially consistent, thereby reducing the risk of hot spot phenomena of the solar cell, and in turn, improving the reliability and safety performance of the solar cell.

In some embodiments, the trend of change in the thickness of each first photovoltaic conversion layer along the first direction is negatively correlated to a trend of change in a dimension of each first photovoltaic conversion layer along the first direction. In these embodiments of this application, the sub-cells are arranged along the first direction. In a process of forming each sub-cell, the dimension of the first photovoltaic conversion layer of each sub-cell along the first direction may be adjusted at the same time to achieve the purpose of adjusting the cross-sectional area, thereby facilitating the adjustment.

In some embodiments, along the first direction, the thicknesses of the first photovoltaic conversion layers decrease stepwise. The cross-sectional areas, perpendicular to the thickness direction, of the first photovoltaic conversion layers, increase stepwise. In these embodiments of this application, the trend of change in the cross-sectional area, perpendicular to the thickness direction, of each first photovoltaic conversion layer, is negatively correlated to the trend of change in the thickness, thereby adjusting the uniformity of photocurrents converted and output by the sub-cells.

In some embodiments, dimensions of the first photovoltaic conversion layers along the first direction increase stepwise so that the cross-sectional areas, perpendicular to the thickness direction, of the first photovoltaic conversion layers, increase stepwise. In these embodiments of this application, the cross-sectional area, perpendicular to the thickness direction, of each first photovoltaic conversion layer is increased by increasing the dimension of the first photovoltaic conversion layer along the first direction, thereby facilitating the adjustment of the cross-sectional area.

In some embodiments, the solar cell includes a plurality of dead zones. The dead zones are disposed between two adjacent sub-cells to implement an electrical connection between the two adjacent sub-cells. Along the first direction, the trend of change in the thickness of the first photovoltaic conversion layer of each sub-cell is positively correlated to a trend of change in a cross-sectional area, perpendicular to the thickness direction, of each dead zone. In these embodiments of this application, the larger the cross-sectional area, perpendicular to the thickness direction, of the dead zone, the larger the series resistance that the dead zone constitutes; the smaller the cross-sectional area, perpendicular to the thickness direction, of the dead zone, the smaller the series resistance that the dead zone constitutes. The sub-cell with a relatively thick first photovoltaic conversion layer is more absorbent of incident light, and the photocurrent of the sub-cell can be reduced by implementing a relatively large internal series connection. The sub-cell with a relatively thin first photovoltaic conversion layer is less absorbent of light, and the photocurrent of the sub-cell can be increased by implementing a relatively small internal series connection. In this way, the photocurrents output by all sub-cells are substantially consistent, thereby improving the uniformity.

In some embodiments, along the first direction, the thicknesses of the first photovoltaic conversion layers decrease stepwise. The cross-sectional areas, perpendicular to the thickness direction, of the dead zones, decrease stepwise. In these embodiments of this application, the trend of change in the cross-sectional area, perpendicular to the thickness direction, of each dead zone, is positively correlated to the trend of change in the thickness, thereby adjusting the homogeneity of photocurrents converted and output by all the sub-cells.

In some embodiments, along the first direction, dimensions of the dead zones along the first direction decrease stepwise so that the cross-sectional areas, perpendicular to the thickness direction, of the dead zones, decrease stepwise. In these embodiments of this application, the cross-sectional areas, perpendicular to the thickness direction, of the dead zones, are decreased by decreasing the dimensions of the dead zones along the first direction, thereby facilitating the adjustment of the cross-sectional area.

In some embodiments, the plurality of dead zones each include: a first electrode layer, a second photovoltaic conversion layer, a second electrode layer, and a run-through portion. The second photovoltaic conversion layer includes a first main portion and a first connecting portion connected to the first main portion. The first main portion is located on a surface of the first electrode layer. The first connecting portion connects the first main portion and the first electrode layer. The second electrode layer includes a first body portion and a first extension portion. The first body portion is located on a surface of the second photovoltaic conversion layer, the surface being away from the first electrode layer. The first extension portion connects the first body portion and the first electrode layer. The run-through portion runs through the first body portion and extends to a surface of the first electrode layer, the surface being close to the second photovoltaic conversion layer. Along the first direction, a dimension of at least one of the first connecting portion, the first extension portion, or the run-through portion in the first direction decreases stepwise. In these embodiments of this application, the cross-sectional area, perpendicular to the thickness direction, of the dead zone, is adjusted by adjusting the dimension of at least one of the first connecting portion, the first extension portion, or the run-through portion in the first direction, thereby facilitating the adjustment of the cross-sectional area.

In some embodiments, the sub-cell further includes an electron transport layer, the electron transport layer is connected to the first photovoltaic conversion layer, and the electron transport layer is configured to transport electrons; and/or the sub-cell further includes a hole transport layer, the hole transport layer is connected to the first photovoltaic conversion layer, and the hole transport layer is configured to transport holes. In these embodiments of this application, the electron transport layer and/or the hole transport layer can improve the photovoltaic conversion efficiency of the solar cell.

According to a second aspect, an embodiment of this application further provides a photovoltaic module, including the solar cell according to an embodiment in the first aspect of this application.

According to a third aspect, an embodiment of this application further provides an electrical device, including the photovoltaic module according to an embodiment in the second aspect of this application.

BRIEF DESCRIPTION OF DRAWINGS

To describe the technical solutions of some embodiments of this application more clearly, the following outlines the drawings used in the embodiments of this application. Evidently, the drawings outlined below are merely a part of embodiments of this application. A person of ordinary skill in the art may derive other drawings from the outlined drawings without making any creative efforts.

Figure 1:
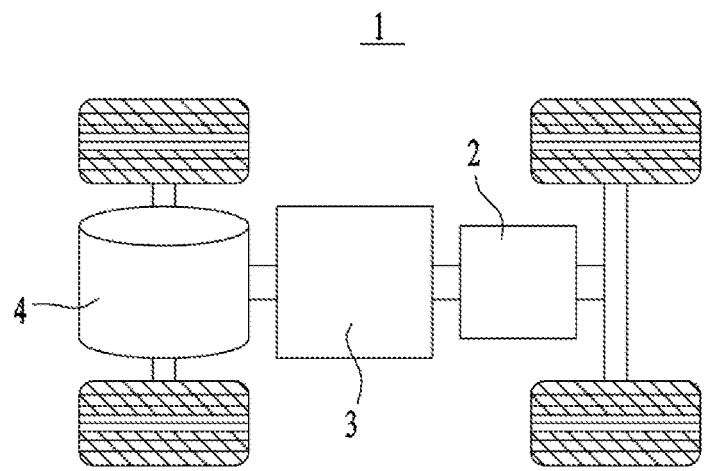
FIG. 1 is a schematic structural diagram of a vehicle according to some embodiments of this application.

The drawings are not necessarily drawn to scale.

LIST OF REFERENCE NUMERALS

X. thickness direction; Y. first direction; P1. first hollowed portion; P2. second hollowed portion; P3. third hollowed portion;
1. vehicle; 2. photovoltaic module; 3. controller; 4. motor;
5. solar cell;
50. substrate;
51. first electrode layer;
52. photovoltaic conversion layer; 521. first photovoltaic conversion layer; 522. second photovoltaic conversion layer;
53. second electrode layer;
6. sub-cell; 6a. first sub-cell; 6b. second sub-cell;
7. dead zone; 7a. first dead zone; 7b. second dead zone; 71. first main portion; 72. first connecting portion; 73. first body portion; 74. first extension portion; 75. run-through portion.

DETAILED DESCRIPTION OF EMBODIMENTS

To make the objectives, technical solutions, and advantages of the embodiments of this application clearer, the following gives a clear description of the technical solutions in the embodiments of this application with reference to the drawings in the embodiments of this application. Evidently, the described embodiments are merely a part of but not all of the embodiments of this application. All other embodiments derived by a person of ordinary skill in the art based on the embodiments of this application without making any creative efforts still fall within the protection scope of this application.

Unless otherwise defined, all technical and scientific terms used herein have the same meanings as what is normally understood by a person skilled in the technical field of this application. The terms used in the specification of this application are merely intended to describe specific embodiments but not intended to limit this application. The terms "include" and "contain" and any variations thereof used in the specification, claims, and brief description of drawings of this application are intended as non-exclusive inclusion. The terms such as "first" and "second" used in the specification, claims, and brief description of drawings herein are intended to distinguish between different items, but are not intended to describe a specific sequence or order of precedence.

Reference to "embodiment" in this application means that a specific feature, structure or characteristic described with reference to the embodiment may be included in at least one embodiment of this application. Reference to this term in different places in the specification does not necessarily represent the same embodiment, nor does it represent an independent or alternative embodiment in a mutually exclusive relationship with other embodiments.

In the description of this application, unless otherwise expressly specified and defined, the terms "mount", "concatenate", "connect", and "attach" are understood in a broad sense. For example, a "connection" may be a fixed connection, a detachable connection, or an integrated connection; or may be a direct connection or an indirect connection implemented through an intermediary; or may be internal communication between two components. A person of ordinary skill in the art is able to understand the specific meanings of the terms in this application according to specific situations.

The term "and/or" in this application indicates merely a relation for describing the related items, and represents three possible relationships. For example, "A and/or B" may represent the following three circumstances: A alone, both A and B, and B alone. In addition, the character "/" herein generally indicates an "or" relationship between the item preceding the character and the item following the character.

In embodiments of this application, the same reference numeral denotes the same component. For brevity, detailed descriptions of the same component are omitted in a different embodiment. Understandably, dimensions such as thickness, length, and width of various components in the embodiments of this application shown in the drawings, and dimensions such as overall thickness, length, and width of an integrated device are merely illustrative descriptions, but do not constitute any limitation on this application.

"A plurality of" referred to in this application means two or more (including two).

In an embodiment of this application, a solar cell is a photovoltaic conversion device that directly converts optical energy into electrical energy based on the theory of photovoltaic effect. Different materials are used in the photovoltaic conversion device, and the quasi-Fermi energy level varies between different materials, thereby forming a built-in electric field inside the photovoltaic conversion device. Under illumination, photons with higher energy are absorbed, and photocarriers (electron-hole pairs) are excited. With different types of charges, electrons and holes drift in opposite directions under the action of the built-in electric field. The electrons move toward a negative electrode, and the holes move toward a positive electrode, thereby forming a potential difference between the positive electrode and the negative electrode, and generating a current.

A solar cell includes a photovoltaic conversion layer for performing photovoltaic conversion. A light absorption coefficient of a photovoltaic conversion layer made of a specified material is a fixed value. The thickness of the photovoltaic conversion layer is positively correlated to the light absorptivity of the photovoltaic conversion layer. The light absorptivity of the photovoltaic conversion layer determines the value of the photocurrent that can be converted and output by the photovoltaic conversion layer. Therefore, the thickness of the photovoltaic conversion layer is positively correlated to the photocurrent. The thicker the photovoltaic conversion layer, the greater the photocurrent that the photovoltaic conversion layer can convert and output, and the higher the photovoltaic conversion efficiency. The thinner the photovoltaic conversion layer, the lower the photocurrent that the photovoltaic conversion layer can convert the output, and the lower the photovoltaic conversion efficiency.

The applicant hereof finds that, when a solar cell is split into a plurality of sub-cells, the solar cell is usually divided into sub-cells of equal widths. The equal-width division means that the widths of all the sub-cells are equal and the widths of all dead zones are equal. However, during preparation of the photovoltaic conversion layer, the thickness of the photovoltaic conversion layer may be not uniform due to limitation of the preparation process. That is, the thickness of some regions is large while the thickness of other regions is small. In a thicker region, the photocurrent that the sub-cell can convert and output is larger. In a thinner region, the photocurrent that the sub-cell can convert and output is smaller. Therefore, the difference in thickness leads to inconsistency of the photocurrents that can be output by the sub-cells. When the sub-cells are connected in series, the sub-cell with a relatively small photocurrent output imposes a current limit on the whole solar cell, thereby resulting in a relatively small current of the solar cell as a whole, and in turn, reducing the photovoltaic conversion efficiency of the solar cell. In addition, due to the inconsistency of the photocurrents that can be output by the sub-cells, the temperature distribution of the whole solar cell is uneven, thereby being prone to a risk of damage caused by the hot spot effect.

In view of the above problems, the applicant discloses a technical solution. In this technical solution, the width of each sub-cell is designed based on the thickness of the first photovoltaic conversion layer of each sub-cell. In this way, along the first direction, the trend of change in the thickness of the first photovoltaic conversion layer of each sub-cell is negatively correlated to the trend of change in the cross-sectional area, perpendicular to the thickness direction, of each first photovoltaic conversion layer, thereby achieving substantive consistency of the photocurrents generated by the sub-cells. In a solar cell that assumes this structure, the currents of sub-cells are equivalently identical, and basically impose no current limit on the whole solar cell, thereby improving the photovoltaic conversion efficiency of the solar cell. In addition, the photocurrents of all sub-cells are substantially identical, thereby reducing the risk of hot spot phenomena of the solar cell, and improving the reliability and safety performance of the solar cell.

The technical solution described in this embodiment of this application is applicable to a photovoltaic module containing a solar cell, and an electrical device that uses the photovoltaic module.

The electrical device may be a vehicle, a mobile phone, a portable device, a notebook computer, a ship, a spacecraft, an electric toy, an electric tool, or the like. The vehicle may be an oil-fueled vehicle, a natural gas vehicle, or a new energy vehicle. The spacecraft includes an airplane, a rocket, a space shuttle, a spaceship, and the like. The electric toy includes a fixed or mobile electric toy, such as a game console, an electric car toy, an electric ship toy, an electric airplane toy, and the like. The electric tool includes an electrical metal cutting tool, an electrical grinding tool, an electrical assembling tool, and an electric tool for use in railways. Examples of the electric tool are an electrical drill, an electrical grinder, an electrical wrench, an electrical screwdriver, an electrical hammer, an electrical impact drill, a concrete vibrator, an electrical planer, and the like. The electrical device is not particularly limited in embodiments of this application.

For ease of description in the following embodiments, a vehicle is used as an example of the electrical device.

FIG. 1 is a schematic structural diagram of a vehicle according to some embodiments of this application. As shown in FIG. 1, a photovoltaic module 2 is disposed inside the vehicle 1. The photovoltaic module 2 may be disposed at the top, front, or rear of the vehicle 1. The photovoltaic module 2 may be configured to supply power to the vehicle 1. For example, the photovoltaic module 2 may serve as an operating power supply of the vehicle 1.

The vehicle 1 may further include a controller 3 and a motor 4. The controller 3 is configured to control the photovoltaic module 2 to supply power to the motor 4, for example, to meet electrical energy requirements in starting, navigating, or running the vehicle 1.

In some embodiments of this application, the photovoltaic module 2 serves not only as an operating power supply of the vehicle 1, but may also serve as a driving power supply of the vehicle 1 to provide driving power for the vehicle 1 in place of or partly in place of fuel oil or natural gas.

Figure 2:
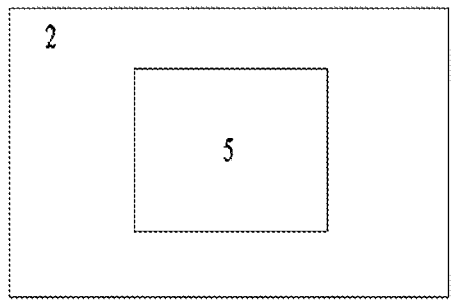
FIG. 2 is a schematic block diagram of a photovoltaic module according to some embodiments of this application.

FIG. 2 is a schematic block diagram of a photovoltaic module according to some embodiments of this application. As shown in FIG. 2, the photovoltaic module 2 includes a solar cell 5. There may be one or more solar cells 5. If there are a plurality of solar cells 5, the plurality of solar cells 5 may be connected in series, parallel, or series-and-parallel pattern. The series-and-parallel pattern means that some of the solar cells 5 are connected in series and other solar cells are connected in parallel so as to provide relatively high voltage and capacity.

Figure 3:
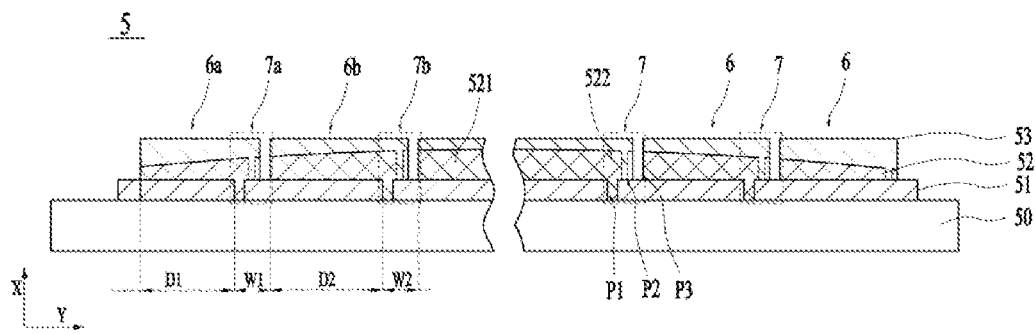
FIG. 3 is a schematic structural diagram of a solar cell according to some embodiments of this application.

FIG. 3 is a schematic structural diagram of a solar cell according to some embodiments of this application.

As shown in FIG. 3, the solar cell 5 according to an embodiment of this application includes a plurality of sub-cells 6. The plurality of sub-cells 6 are disposed sequentially along a first direction Y. The plurality of sub-cells 6 each include a first photovoltaic conversion layer 521 for performing photovoltaic conversion. Along the first direction Y, a trend of change in a thickness of the first photovoltaic conversion layer 521 of each sub-cell 6 is negatively correlated to a trend of change in a cross-sectional area, perpendicular to the thickness direction X, of each first photovoltaic conversion layer 521, so as to improve homogeneity of photocurrents output by the sub-cells 6.

The solar cell 5 includes a plurality of sub-cells 6 connected in series. The plurality of sub-cells 6 can increase the voltage and capacity of the solar cell 5. The plurality of sub-cells 6 are disposed sequentially along the first direction Y. The first direction Y may be a width direction or a length direction of the sub-cells 6. The X-direction shown in FIG. 3 represents the thickness direction of the sub-cells 6, the Y-direction represents the first direction, and the first direction Y is perpendicular to the thickness direction X.

As a core functional layer of the sub-cell 6, the first photovoltaic conversion layer 521 primarily serves to form electron-hole pairs inside after absorbing external light. The electrons and holes are separated, extracted, and output, and then ready for output to the outside. As an example, the first photovoltaic conversion layer 521 may include a perovskite photovoltaic conversion layer, a cadmium zinc telluride photovoltaic conversion layer, a copper indium gallium selenide photovoltaic conversion layer, a copper indium selenide photovoltaic conversion layer, or a copper indium gallium sulfur photovoltaic conversion layer.

When the solar cell 5 forms the first photovoltaic conversion layer 521 of each sub-cell 6, the thickness of the first photovoltaic conversion layer 521 of each sub-cell 6 is not uniform along the first direction Y due to limitation of the preparation process, but takes on a trend of change. Specifically, the trend of change in thickness may be a trend of decreasing or increasing stepwise along the first direction Y; or a trend of increasing and then decreasing along the first direction Y; or a trend of decreasing and then increasing along the first direction Y. In this embodiment of this application, the trend of change in thickness may be linear change or non-linear change, which is not limited herein.

The thickness of the first photovoltaic conversion layer 521 is positively correlated to the light absorptivity. The larger the thickness, the higher the light absorptivity, and the larger the photocurrent that the sub-cell 6 can convert and output. The smaller the thickness, the lower the light absorptivity, and the smaller the photocurrent that the sub-cell 6 can convert and output. When the first photovoltaic conversion layer 521 of each sub-cell 6 takes on a trend of change in thickness, the value of the photocurrent output by each sub-cell 6 also takes on a corresponding trend of change.

When the thickness of the first photovoltaic conversion layer 521 is a constant value, the photovoltaic conversion area of the first photovoltaic conversion layer 521 is also positively correlated to the photocurrent. The photovoltaic conversion area means an area in which the first photovoltaic conversion layer 521 can effectively utilize light and perform photovoltaic conversion, and specifically a cross-sectional area, perpendicular to the thickness direction X, of the first photovoltaic conversion layer 521. The larger the photovoltaic conversion area, the more optical energy can be absorbed, and the larger the photocurrent converted and output by the first photovoltaic conversion layer 521. The smaller the photovoltaic conversion area, the less optical energy can be absorbed, and the smaller the photocurrent output by the first photovoltaic conversion layer 521. This embodiment of this application adjusts the photovoltaic conversion area based on the thickness of the first photovoltaic conversion layer 521, thereby implementing effective regulation of the photocurrent of each sub-cell 6. In other words, when the thickness of the first photovoltaic conversion layer 521 is relatively large, the first photovoltaic conversion layer is more absorbent of incident light, and the light receiving area can be reduced by using a relatively small photovoltaic conversion area, so as to reduce the photocurrent of the sub-cell. When the thickness of the first photovoltaic conversion layer 521 is relatively small, the first photovoltaic conversion layer is less absorbent of incident light, and the light receiving area can be increased by using a relatively large photovoltaic conversion area, so as to increase the photocurrent of the sub-cell. In this way, the photocurrents output of the sub-cells 6 are adjusted to be substantially consistent, thereby improving the uniformity. Uniformity specifically means that the photocurrents output by all sub-cells are substantially identical.

In this embodiment of this application, along the first direction Y, the trend of change in the thickness of the first photovoltaic conversion layer 521 of each sub-cell 6 is negatively correlated to the trend of change in the cross-sectional area, perpendicular to the thickness direction X, of each first photovoltaic conversion layer 521. In other words, the relatively thick first photovoltaic conversion layer 521 combines with a relatively small photovoltaic conversion area, and the relatively thin first photovoltaic conversion layer 521 combines with a relatively large photovoltaic conversion area, so as to adjust the uniformity of the converted and output photocurrents between the sub-cells 6. On the one hand, this causes the overall temperature of the solar cell 5 to be distributed uniformly, thereby reducing the risk of occurrence of hot spots in the solar cell 5, and improving the reliability and safety performance of the solar cell 5. On the other hand, this avoids current limitation caused by some sub-cells 6 among the sub-cells 6, and increases the overall current of the solar cell 5, thereby improving the overall photovoltaic conversion efficiency of the solar cell 5.

The cross-sectional area, perpendicular to the thickness direction X, of the first photovoltaic conversion layer 521, is a product of a width and a length of the first photovoltaic conversion layer 521. The cross-sectional area, perpendicular to the thickness direction X, of the first photovoltaic conversion layer 521, may be adjusted by adjusting the width and/or length of the first photovoltaic conversion layer 521.

Still referring to FIG. 3, in some embodiments, the trend of change in the thickness of each first photovoltaic conversion layer 521 along the first direction Y is negatively correlated to a trend of change in a dimension of each first photovoltaic conversion layer 521 along the first direction Y. The sub-cells 6 are arranged along the first direction Y. In a process of forming each sub-cell 6, the dimension of the first photovoltaic conversion layer 521 of each sub-cell 6 along the first direction Y may be adjusted to achieve the purpose of adjusting the cross-sectional area, perpendicular to the thickness direction X, of the first photovoltaic conversion layer 521.

The trend of change in the thickness of the first photovoltaic conversion layer 521 is correlated to the specific preparation process, and may take on a variety of change trends. Regardless of the type of trend of change in the thickness of the first photovoltaic conversion layer 521, the trend of change in the cross-sectional area, perpendicular to the thickness direction X, of each first photovoltaic conversion layer 521, is negatively correlated to the trend of change in the thickness, thereby adjusting the uniformity of photocurrents converted and output by the sub-cells 6.

As an example, along the first direction Y, the thicknesses of the first photovoltaic conversion layers 521 decrease stepwise. The cross-sectional areas, perpendicular to the thickness direction X, of the first photovoltaic conversion layers 521, increase stepwise. Specifically, along the first direction Y, the dimensions of the first photovoltaic conversion layers 521 along the first direction Y increase stepwise.

As another example, along the first direction Y, the thicknesses of the first photovoltaic conversion layers 521 increase stepwise. The cross-sectional areas, perpendicular to the thickness direction X, of the first photovoltaic conversion layers 521, decrease stepwise. Specifically, along the first direction Y, the dimensions of the first photovoltaic conversion layers 521 along the first direction Y decrease stepwise.

As another example, along the first direction Y, the thicknesses of the first photovoltaic conversion layers 521 increase stepwise first and then decrease stepwise. The thicknesses take on a trend of being thin on both sides and thick in the middle. When the thicknesses increase stepwise, the cross-sectional areas, perpendicular to the thickness direction X, of the first photovoltaic conversion layers 521, decrease stepwise. Specifically, along the first direction Y, the dimensions of the first photovoltaic conversion layers 521 along the first direction Y decrease stepwise. When the thicknesses decrease stepwise, the cross-sectional areas, perpendicular to the thickness direction X, of the first photovoltaic conversion layers 521, increase stepwise. To be specific, along the first direction Y, the dimensions of the first photovoltaic conversion layers 521 along the first direction Y increase stepwise.

As another example, along the first direction Y, the thicknesses of the first photovoltaic conversion layers 521 decrease stepwise first and then increase stepwise. The thicknesses take on a trend of being thick on both sides and thin in the middle. When the thicknesses decrease stepwise, the cross-sectional areas, perpendicular to the thickness direction X, of the first photovoltaic conversion layers 521, increase stepwise. Specifically, along the first direction Y, the dimensions of the first photovoltaic conversion layers 521 along the first direction Y increase stepwise. When the thicknesses increase stepwise, the cross-sectional areas, perpendicular to the thickness direction X, of the first photovoltaic conversion layers 521, decrease stepwise. Along the first direction Y, the dimensions of the first photovoltaic conversion layers 521 along the first direction Y decrease stepwise.

FIG. 3 shows a trend of the thicknesses of the first photovoltaic conversion layers 521 being thin on both sides and thick in the middle along the first direction Y. As an example, the plurality of sub-cells 6 include at least a first sub-cell 6a and a second sub-cell 6b. The thickness of the first photovoltaic conversion layer 521 in the first sub-cell 6a is greater than the thickness of the first photovoltaic conversion layer 521 in the second sub-cell 6b. Accordingly, the dimension of the first photovoltaic conversion layer 521 in the first sub-cell 6a along the first direction Y is D1, the dimension of the first photovoltaic conversion layer 521 in the second sub-cell 6b along the first direction Y is D2, and D1 is less than D2.

Still referring to FIG. 3, the solar cell 5 in this embodiment of this application includes a substrate 50, a first electrode layer 51, a photovoltaic conversion layer 52, and a second electrode layer 53 that are stacked sequentially along the thickness direction X. The first electrode layer 51 and the second electrode layer 53 are of opposite polarities. The first electrode layer 51 and the second electrode layer 53 are configured to lead out the electric current.

In some embodiments, a method for preparing a solar cell 5 includes the following steps: providing a substrate 50; forming a first electrode layer 51 on the substrate 50, and performing a first etch on the first electrode layer 51 so that a plurality of first hollowed portions P1 running through the first electrode layer 51 are formed in the first electrode layer 51; forming a photovoltaic converter layer 52 on a side of the first electrode layer 51, the side being oriented back from the substrate 50; performing a second etch on the photovoltaic converter layer 52 so that a plurality of second hollowed portions P2 are formed in the photovoltaic conversion layer 52; forming a second electrode layer 53 on a side of the photovoltaic conversion layer 52, the side being oriented back from the substrate 50, where the second electrode layer 53 extends into the second hollowed portions P2; and performing a third etch on the second electrode layer 53 and the photovoltaic conversion layer 52 so that a plurality of third hollowed portions P3 are formed in the second electrode layer 53 and the photovoltaic conversion layer 52, thereby obtaining a plurality of sub-cells 6 connected in series.

In some embodiments, in order to improve the transport efficiency of electrons, each sub-cell 6 of the solar cell 5 may include an electron transport layer connected to the photovoltaic conversion layer 52 and configured to transport electrons, obstruct transport of holes, reduce recombination of electrons and holes, and improve the photovoltaic conversion efficiency.

In some embodiments, in order to improve the transport efficiency of holes, each sub-cell 6 of the solar cell 5 may include an hole transport layer connected to the photovoltaic conversion layer 52 and configured to transport holes, obstruct transport of electrons, reduce recombination of holes and electrons, and improve the photovoltaic conversion efficiency.

The following describes a structure of the solar cell 5 in detail by using an example in which the solar cell 5 is a perovskite solar cell. The perovskite solar cell may be of a regular configuration (n-i-p structure) or an inverted configuration (p-i-n structure).

The regular perovskite solar cell includes a transparent conductive electrode, an electron transport layer, a perovskite photovoltaic conversion layer, a hole transport layer, and a metal electrode that are stacked sequentially along the thickness direction of the solar cell. As an example, the transparent conductive electrode includes an indium tin oxide ITO or a fluorine-doped tin oxide FTO. The electron transport layer includes a titanium oxide layer or the like. The hole transport layer includes 2,2',7,7'-tetrakis[N,N-bis (4-methoxyphenyl)amino]-9,9'-spirobifluorene (Spiro-OMeTAD) and the like. The metal electrode includes a gold layer, a silver layer, or an aluminum layer.

The inverted perovskite solar cell includes a transparent conductive electrode, a hole transport layer, a perovskite photovoltaic conversion layer, an electron transport layer, and a metal electrode that are stacked sequentially along the thickness direction of the solar cell. As an example, the transparent conductive electrode includes an indium tin oxide ITO layer or a fluorine-doped tin oxide FTO layer. The hole transport layer includes a PEDOT: PSS layer, where PEDOT denotes a polymer of EDOT (3,4-ethylenedioxythiophene) monomers, and PSS denotes polystyrene sulfonate (PSS). The electron transport layer includes a fullerene derivative ([6,6]-phenyl-C61-butyric acid methyl ester) layer, or a C60 layer. The metal electrode includes a gold layer, a silver layer, or an aluminum layer. The preparation process of the solar cell 5 of this structure is relatively simple.

As an example of the preparation process of an inverted perovskite solar cell, the specific preparation process includes:
  providing a substrate;
  forming a transparent conductive electrode on a surface of the substrate by magnetron sputtering or by a chemical means;
  performing a first etch by using laser etching, masking, or exposure so that a plurality of first hollowed portions that run through the transparent conductive electrode are formed in the transparent conductive electrode;
  forming a hole transport layer on a surface, oriented back from the substrate, of the transparent conductive electrode by magnetron sputtering, chemical deposition, atomic layer deposition ALD, or coating;
  forming a perovskite photovoltaic conversion layer on a surface, oriented back from the substrate, of the hole transport layer by coating, spraying, spin-coating, evaporation, or chemical deposition;
  forming an electron transport layer on a surface, oriented back from the substrate, of the perovskite photovoltaic conversion layer by magnetron sputtering, chemical deposition, atomic layer deposition ALD, or coating;
  performing a second etch by laser etching, masking, or exposure, so as to form a plurality of second hollowed portions in the hole transport layer, the perovskite photovoltaic conversion layer, and the electron transport layer separately;
  forming a metal electrode on a surface, oriented back from the substrate, of the electron transport layer by magnetron sputtering, chemical deposition, atomic layer deposition ALD, or coating; and
  performing a third etch by laser etching, masking, or exposure, so as to form third hollowed portions in the metal electrode, the hole transport layer, the perovskite photovoltaic conversion layer, and the electron transport layer separately.

On the basis of the above steps, a positive output electrode and a negative output electrode may be welded by means of conductive tape bonding, ultrasonic welding, laser welding, or a by using a soldering flux, so as to form external output electrodes. Subsequently, the surface, oriented back from the substrate, of the metal electrode is irradiated to form an adhesive film. A cover glass is disposed on a side, oriented back from the substrate, of the adhesive film. Finally, the entirety is fed into a laminator or an autoclave for being press-fitted and packaged.

In some embodiments, the solar cell 5 includes a plurality of dead zones 7. The dead zones 7 are disposed between two adjacent sub-cells 6 to implement an electrical connection between the two adjacent sub-cells 6. Along the first direction Y, the trend of change in the thickness of the first photovoltaic conversion layer 521 of each sub-cell 6 is positively correlated to a trend of change in a cross-sectional area, perpendicular to the thickness direction X, of each dead zone 7.

A plurality of dead zones 7 are formed while the solar cell 5 is divided into a plurality of sub-cells 6. The dead zones 7 are disposed between two adjacent sub-cells 6 to implement an electrical connection between the two adjacent sub-cells 6. In this embodiment of this application, the fill factor and photovoltaic conversion efficiency of the solar cell 5 can be optimized by adjusting the cross-sectional areas, perpendicular to the thickness direction X, of the dead zones 7 on the basis that the thicknesses of the first photovoltaic conversion layers 521 take on a trend of change.

There is a contact resistance between the first electrode layer 51 and the second electrode layer 53 located in the dead zones 7. The photovoltaic conversion layer 52 located in the dead zones 7 possesses a resistance. Such resistances constitute a series resistance. The larger the cross-sectional area, perpendicular to the thickness direction X, of the dead zone 7, the larger the area of light loss. The larger the dead zone 7, the larger the series resistance formed by the dead zone, thereby reducing the photocurrent output by the sub-cell 6. The smaller the cross-sectional area, perpendicular to the thickness direction X, of the dead zone 7, the smaller the area of light loss, and the smaller the series resistance formed by the dead zone, thereby increasing the photocurrent output by the sub-cell 6. By adjusting the cross-sectional area, perpendicular to the thickness direction X, of the dead zone 7, this application can optimize the series resistance, improve the photocurrent, and in turn, improve the photovoltaic conversion efficiency of the solar cell 5.

In this embodiment of this application, the trend of change in the thickness of the photovoltaic conversion layer 52 in the first direction Y is substantially consistent with the trend of change in the thickness of the first photovoltaic conversion layer 521 in the first direction Y. The trend of change in the thickness of the photovoltaic conversion layer 52 in the first direction Y is substantially consistent with the trend of change in the thickness of the second photovoltaic conversion layer 522 in the first direction Y.

In this embodiment of this application, the trend of change in the thicknesses of the first photovoltaic conversion layers 521 of the sub-cells 6 is positively correlated to the trend of change in the cross-sectional areas, perpendicular to the thickness direction X, of the dead zones 7. A relatively thick first photovoltaic conversion layer 521 combines with the dead zone 7 of a relatively large cross-sectional area, and a relatively thin first photovoltaic conversion layer 521 combines with the dead zone 7 of a relatively small cross-sectional area, thereby further adjusting the uniformity of the converted and output currents between the sub-cells 6.

Regardless of the type of trend of change in the thickness of the first photovoltaic conversion layer 521, the trend of change in the cross-sectional area, perpendicular to the thickness direction X, of each dead zone 7, is positively correlated to the trend of change in the thickness, thereby adjusting the uniformity of photocurrents converted and output by the sub-cells 6. Specifically, the cross-sectional area, perpendicular to the thickness direction X, of the dead zone 7, may be adjusted by adjusting the length and/or width of the dead zone 7.

As an example, along the first direction Y, the thicknesses of the first photovoltaic conversion layers 521 decrease stepwise. The cross-sectional areas, perpendicular to the thickness direction X, of the dead zones 7, decrease stepwise. Specifically, along the first direction Y, the dimensions of the dead zones 7 along the first direction Y decrease stepwise.

As another example, along the first direction Y, the thicknesses of the first photovoltaic conversion layers 521 increase stepwise. The cross-sectional areas, perpendicular to the thickness direction X, of the dead zones 7, increase stepwise. Specifically, along the first direction Y, the dimensions of the dead zones 7 along the first direction Y increase stepwise.

As another example, along the first direction Y, the thicknesses of the first photovoltaic conversion layers 521 increase stepwise first, and then decrease stepwise. When the thicknesses increase stepwise, the cross-sectional areas, perpendicular to the thickness direction X, of the dead zones 7, increase stepwise. Specifically, along the first direction Y, the dimensions of the dead zones 7 along the first direction Y increase stepwise. When the thicknesses decrease stepwise, the cross-sectional areas, perpendicular to the thickness direction X, of the dead zones 7, decrease stepwise. To be specific, along the first direction Y, the dimensions of the dead zones 7 along the first direction Y decrease stepwise.

As another example, along the first direction Y, the thicknesses of the first photovoltaic conversion layers 521 decrease stepwise first, and then increase stepwise. When the thicknesses decrease stepwise, the cross-sectional areas, perpendicular to the thickness direction X, of the dead zones 7, decrease stepwise. Specifically, along the first direction Y, the dimensions of the dead zones 7 along the first direction Y decrease stepwise. When the thicknesses increase stepwise, the cross-sectional areas, perpendicular to the thickness direction X, of the dead zones 7, increase stepwise. Along the first direction Y, the dimensions of the dead zones 7 along the first direction Y increase stepwise.

Along the first direction Y, the thicknesses of the photovoltaic conversion layers 52 of the solar cell 5 shown in FIG. 3 take on a trend of increasing stepwise first and then decreasing stepwise. As an example, the plurality of dead zones 7 include at least a first dead zone 7a and a second dead zone 7b. The thicknesses of the photovoltaic conversion layers 52 decrease stepwise in a direction from the first dead zone 7a to the second dead zone 7b. Accordingly, the width W1 of the first dead zone 7a is adjusted to be greater than the width W2 of the second dead zone 7b, thereby reducing the cross-sectional area, perpendicular to the thickness direction X, of the dead zone 7, and in turn, reducing the series resistance.

The dead zone 7 includes a region located from a first hollowed portion P1 to a third hollowed portion P3. In an embodiment of this application, of the first electrode layer 51, the photovoltaic conversion layer 52, and the second electrode layer 53, a part is located in the region of the plurality of sub-cells 6, and another part is located in the dead zones 7. The photovoltaic conversion layer 52 is divided into two parts including a first photovoltaic conversion layer 521 and a second photovoltaic conversion layer 522. The first photovoltaic conversion layer 521 is located in the region of the sub-cell 6, and the second photovoltaic conversion layer 522 is located in the dead zone 7.

Figure 4:
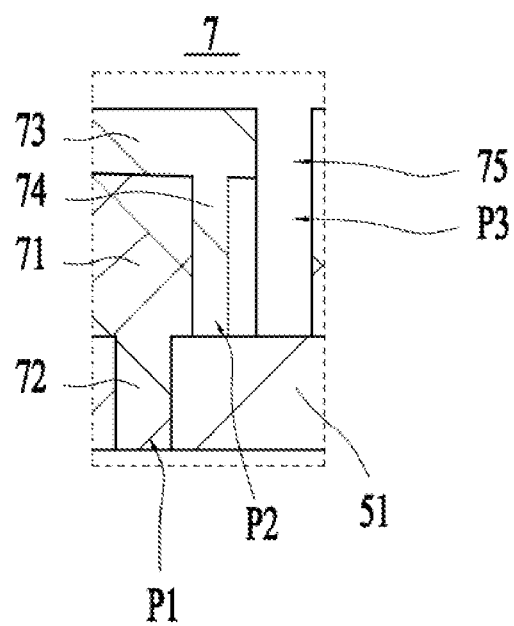
FIG. 4 is a close-up view of a dead zone of the solar cell shown in FIG. 3.

FIG. 4 is a close-up view of a dead zone of the solar cell shown in FIG. 3.

As shown in FIG. 3 and FIG. 4, in some embodiments, the second photovoltaic conversion layer 522 located in the dead zone 7 includes a first main portion 71 and a first connecting portion 72. The first main portion 71 is located on a surface of the first electrode layer 51. The first connecting portion 72 connects the first main portion 71 and the first electrode layer 51. The second electrode layer 53 located in the dead zone 7 includes a first body portion 73 and a first extension portion 74. The first body portion 73 is located on a surface, oriented back from the first electrode layer 51, of the first main portion 71. The first extension portion 74 connects the first body portion 73 and the first electrode layer 51 located in the dead zone 7. The dead zone 7 further includes a run-through portion 75. The run-through portion 75 is the third hollowed portion P3 mentioned earlier above. The run-through portion 75 runs through the first body portion 73 and extends to a surface of the first electrode layer 51, the surface being close to the second photovoltaic conversion layer 522. This form of structure simplifies the preparation process and is cost-effective.

In an embodiment of this application, the dimensions of the first connecting portion 72, the first extension portion 74, and the run-through portion 75 are adjusted by adjusting the dimension of at least one of the first hollowed portion P1, the second hollowed portion P2, or the third hollowed portion P3, thereby achieving the purpose of adjusting the cross-sectional area, perpendicular to the thickness direction X, of the dead zone 7. As an example, in order to adjust the cross-sectional area of the dead zone 7 to decrease stepwise, the dimension of at least one of the first hollowed portion P1, the second hollowed portion P2, or the third hollowed portion P3 in the first direction Y is adjusted to decrease stepwise. Accordingly, the dimension of at least one of the first connecting portion 72, the first extension portion 74, or the run-through portion 75 in the first direction Y decreases stepwise. Alternatively, in order to adjust the cross-sectional area of the dead zone 7 to increase stepwise, the dimension of at least one of the first hollowed portion P1, the second hollowed portion P2, or the third hollowed portion P3 in the first direction Y is adjusted to increase stepwise. Accordingly, the dimension of at least one of the first connecting portion 72, the first extension portion 74, or the run-through portion 75 in the first direction Y increases stepwise. In this embodiment of this application, the purpose of adjusting the size of the dead zone 7 is achieved by adjusting the dimension of each hollowed portion during the etching, thereby improving the photovoltaic conversion efficiency.

Although this application has been described with reference to exemplary embodiments, various improvements may be made to the embodiments without departing from the scope of this application, and the components of this application may be replaced with equivalents. Particularly, to the extent that no structural conflict exists, various technical features mentioned in various embodiments may be combined in any manner. This application is not limited to the specific embodiments disclosed herein, but includes all technical solutions falling within the scope of the claims.

What is claimed is:
1. A solar cell, comprising:
   a plurality of sub-cells;
   a plurality of dead zones, each disposed between two adjacent sub-cells to implement an electrical connection between the two adjacent sub-cells;

wherein:
the plurality of sub-cells are disposed sequentially along a first direction, each of the plurality of sub-cells comprises a first photovoltaic conversion layer for performing photovoltaic conversion, and the first direction is perpendicular to a thickness direction of the plurality of sub-cells; and
along the first direction, a trend of change in a thickness of the first photovoltaic conversion layer of each of the plurality of sub-cells is:
negatively correlated to a trend of change in a cross-sectional area, perpendicular to the thickness direction, of the first photovoltaic conversion layer, so as to improve uniformity of photocurrents output by all the plurality of sub-cells; and
positively correlated to a trend of change in a cross-sectional area, perpendicular to the thickness direction, of each of the plurality of dead zones.

2. The solar cell according to claim 1, wherein:
the trend of change in the thickness of the first photovoltaic conversion layer along the first direction is negatively correlated to a trend of change in a dimension of the first photovoltaic conversion layer along the first direction.

3. The solar cell according to claim 1, wherein:
along the first direction, thicknesses of first photovoltaic conversion layers of the plurality of sub-cells decrease stepwise, and cross-sectional areas, perpendicular to the thickness direction, of the first photovoltaic conversion layers, increase stepwise.

4. The solar cell according to claim 3, wherein:
dimensions of the first photovoltaic conversion layers along the first direction increase stepwise so that the cross-sectional areas, perpendicular to the thickness direction, of the first photovoltaic conversion layers, increase stepwise.

5. The solar cell according to claim 1, wherein:
along the first direction, thicknesses of first photovoltaic conversion layers of the plurality of sub-cells decrease stepwise, and cross-sectional areas, perpendicular to the thickness direction, of the plurality of dead zones, decrease stepwise.

6. The solar cell according to claim 5, wherein:
along the first direction, dimensions of the dead zones along the first direction decrease stepwise so that the cross-sectional areas, perpendicular to the thickness direction, of the dead zones, decrease stepwise.

7. The solar cell according to claim 6, wherein each of the plurality of dead-zones comprises:
a first electrode layer;
a second photovoltaic conversion layer, comprising a first main portion and a first connecting portion connected to the first main portion, wherein the first main portion is located on a surface of the first electrode layer, and the first connecting portion connects the first main portion and the first electrode layer;
a second electrode layer, comprising a first body portion and a first extension portion, wherein the first body portion is located on a surface of the second photovoltaic conversion layer, the surface being away from the first electrode layer, and the first extension portion connects the first body portion and the first electrode layer; and
a run-through portion, running through the first body portion and extending to a surface of the first electrode layer, the surface being close to the second photovoltaic conversion layer;
wherein along the first direction, a dimension of at least one of the first connecting portion, the first extension portion, or the run-through portion in the first direction decreases stepwise.

8. The solar cell according to claim 1, wherein each of the plurality of sub-cells further comprises:
an electron transport layer, connected to the first photovoltaic conversion layer, wherein the electron transport layer is configured to transport electrons; and/or
a hole transport layer, connected to the first photovoltaic conversion layer, wherein the hole transport layer is configured to transport holes.

9. A photovoltaic module, comprising the solar cell according to claim 1.

10. An electrical device, comprising the photovoltaic module according to claim 9.

* * * * *